(12) United States Patent
Tanaka et al.

(10) Patent No.: US 7,036,384 B2
(45) Date of Patent: May 2, 2006

(54) PRESSURE SENSOR

(75) Inventors: Hiroaki Tanaka, Kariya (JP); Manabu Tomisaka, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/180,528

(22) Filed: Jul. 14, 2005

(65) Prior Publication Data

US 2006/0016267 A1    Jan. 26, 2006

(30) Foreign Application Priority Data

Jul. 20, 2004  (JP)  .............................. 2004-211630

(51) Int. Cl.
*G01L 9/16*  (2006.01)

(52) U.S. Cl. ...................................... 73/754

(58) Field of Classification Search .......... 73/715–727, 73/753, 754; 338/4; 257/414–419; 29/25.01, 29/25.02, 25.03, 25.35, 25.41, 25.42, 621.1
See application file for complete search history.

(56) References Cited

U.S. PATENT DOCUMENTS

| 4,766,666 A | * | 8/1988 | Sugiyama et al. ......... 29/621.1 |
| 4,771,638 A | * | 9/1988 | Sugiyama et al. ............ 73/721 |
| 5,595,939 A | | 1/1997 | Otake et al. |
| 5,852,320 A | * | 12/1998 | Ichihashi .................... 257/419 |
| 6,058,781 A | * | 5/2000 | Kusuyama et al. ........... 73/724 |
| 6,393,922 B1 | | 5/2002 | Winterer |
| 2005/0034526 A1 | | 2/2005 | Shinyama et al. |

FOREIGN PATENT DOCUMENTS

| JP | A-10-153508 | 6/1998 |
| JP | A-2001-343298 | 12/2001 |

\* cited by examiner

*Primary Examiner*—William Oen
(74) *Attorney, Agent, or Firm*—Posz Law Group, PLC

(57) ABSTRACT

A pressure sensor includes a semiconductor substrate having a diaphragm in which an electrical circuit including a gauge resistance is formed, an insulation film provided on a surface of the semiconductor substrate, an Al film provided on the insulation film and electrically connected to the electrical circuit through a conductor hole of the insulation film, an Au film provided on the Al film through a Ti film, a first protective film which covers the Al film and has an opening portion from which a portion of the Au film is exposed. In the pressure sensor, a second protective film made of polyimideamide or polyimide covers at least the surface of the Au film exposed from the first protective film, and a vicinity of the opening portion of the first protective film. Therefore, corrosion resistance of the Al film can be prevented while the pressure sensor has a reduced component number.

9 Claims, 6 Drawing Sheets

PRESSURE SENSOR

CROSS REFERENCE TO RELATED APPLICATION

This application is based on Japanese Patent Application No. 2004-211630 filed on Jul. 20, 2004, the contents of which are incorporated herein by reference in its entirety.

FIELD OF THE INVENTION

The present invention relates to a pressure sensor which can prevent corrosion of wirings in a sensor chip. More particularly, the present invention relates to a pressure sensor in which a sensor chip is directly exposed in a corrosive medium.

BACKGROUND OF THE INVENTION

When a pressure sensor is used while a sensor chip is directly exposed in a corrosive liquid, corrosion of wirings or pads may be caused. For example, in a pressure sensor used for detecting a differential pressure of an exhaust gas filter of a diesel vehicle or for detecting a pressure in an engine room, pads and wirings made of aluminum (Al) may be easily corroded. Accordingly, in a pressure sensor described in U.S. Pat. No. 5,595,939 (corresponding to JP patent No. 3198779), a corrosion-resistance structure for preventing corrosion of a chip and a wire bonding portion is described.

For example, in a sensor chip J1 of a pressure sensor shown in FIG. 8, an oxidation film J2 is formed on a surface of a semiconductor substrate in which a diaphragm is formed. Furthermore, an aluminum film (Al film) J3 is formed on the oxidation film J2, and an electrical circuit including a gauge resistance formed in the diaphragm of the semiconductor substrate and the Al film J3 are electrically connected through a conductor hole.

Further, a protective film J4 constructed with two layers of a SiN film and a SiO2 film is formed to cover the Al film J3. An opening portion is provided in the protective film J4 so that a predetermined portion of the Al film J3 is exposed from the opening portion of the protective film J4. Furthermore, a metal film J5 made of Ti is formed on the predetermined portion of the Al film J3, and a wire J6 is bonded to the metal film J5 and a terminal pin J7. Accordingly, the terminal pin J7 and the electrical circuit of the sensor chip J1 are electrically connected.

In this pressure sensor, the sensor chip J1 and a connection portion of the wire J6 are placed in an oil J8, and are sealed by a metal diaphragm having a corrosion resistance. Because the sensor chip J1 and the connection portion of the wire J6 are placed in the oil J8, corrosion of those portions can be prevented. However, in this case, sealing members such as an O-ring are also necessary for the metal diaphragm and for sealing the oil J8. Accordingly, the number of components of the pressure sensor is increased, and the size thereof becomes larger.

SUMMARY OF THE INVENTION

In view of the above-described problems, it is an object of the present invention to provide a pressure sensor, which prevents a corrosion of a sensor chip with a simple structure.

It is another object of the present invention to provide a pressure sensor, which has a corrosion prevention structure while having a small size or/and a reduced component number.

According to the present invention, a pressure sensor includes a semiconductor substrate having a diaphragm in which an electrical circuit including a gauge resistance is formed, an insulation film provided on a surface of the semiconductor substrate and having a conductor hole from which a predetermined portion of the electrical circuit is exposed, a first metal film provided on the insulation film and electrically connected to the electrical circuit through the conductor hole, a second metal film having a corrosion resistance and provided on the first metal film, a first protective film which covers the first metal film and has an opening portion from which a portion of the second metal film is exposed, and a wire bonded to the second metal film at the portion exposed from the first protective film.

In the pressure sensor, a second protective film made of an organic material covers at least the surface of the second metal film exposed from the first protective film, and a vicinity of the opening portion of the first protective film. Therefore, the second protective film can prevent a medium (e.g., corrosion medium) from contacting the Al film through the surface of the second metal film and the vicinity of the opening portion of the first protective film. That is, in the present invention, the second protective film directly contacts at least the surface of the second metal film exposed from the first protective film and the vicinity of the opening portion of the first protective film, so as to directly seal this portion. Accordingly, it can prevent the first metal film from being corroded. Furthermore, the structure of the pressure sensor can be made simple, and the number of the components of the pressure sensor can be reduced.

For example, the second protective film is made of polyimideamide (PEAI) or polyimide (PIQ). Furthermore, the second metal film can be provided approximately on an entire area of the first metal film, and the first protective film can be provided to cover the second metal film. In this case, an exposed area of the first metal film can be further reduced due to the second metal film, and the first metal film is prevented from contacting a corrosion medium.

In the pressure sensor, the first metal film can be formed of an Al film, the second metal film can be formed of an Au film, and the Au film can be provided on the Al film through a Ti film. Alternatively, when the first metal film is formed of a Cu film and the second metal film is formed of an Au film, the Au film can be directly formed on the Cu film.

The second protective film can be provided to cover an entire surface of the first protective film. In this case, the second protective film can effectively prevent the Al film from contacting a corrosion medium. Furthermore, the first protective film can be formed of an oxidation film, or the second metal film can be constructed of two metal layers of an Au film and a Ti film.

BRIEF DESCRIPTION OF THE DRAWINGS

The above and other objects, features and advantages of the present invention will become more apparent from the following detailed description of preferred embodiments made with reference to the accompanying drawings, in which.

DETAILED DESCRIPTION OF PREFERRED EMBODIMENTS

First Embodiment

The first embodiment of the present invention will be now described with reference to FIGS. 1–5D.

Figure 1:
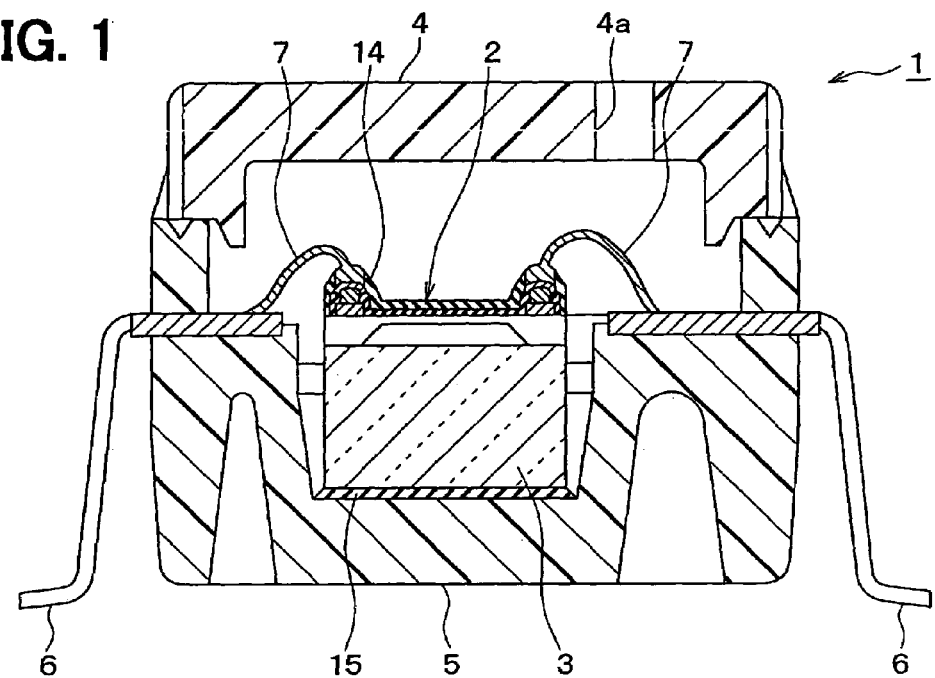
FIG. 1 is a sectional view showing a pressure sensor according to a first preferred embodiment of the present invention.

As shown in FIG. 1, a pressure sensor 1 includes a sensor chip 2, a glass pedestal 3, an upper casing 4, a lower casing 5, terminals 6 and Au wires 7.

The sensor chip 2 includes a semiconductor substrate 8 in which an electrical circuit including a gauge resistance and a diaphragm are formed, an oxidation film 9 formed on the semiconductor substrate 8, an aluminum film (Al film) 10 electrically connected to the electrical circuit through a conductor hole formed in the oxidation film 9, and a protection film 11 arranged to cover the Al film 10. The protection film 11 has an opening portion from which a predetermined portion of the Al film 10 is exposed. The protection film 11 is composed of two layers of a SiN film and a SiO2 film. The predetermined portion of the Al film 10 is coated by a Ti film 12 and an Au film 13, in this order.

Because the Au film 13 having a high corrosion resistance is further formed on the Ti layer 12, the Al film 10 is difficult to contact a corrosive medium such as a corrosive liquid or a corrosive gas. Generally, the Al film 10 is easily corroded by a corrosive medium.

Figure 2:
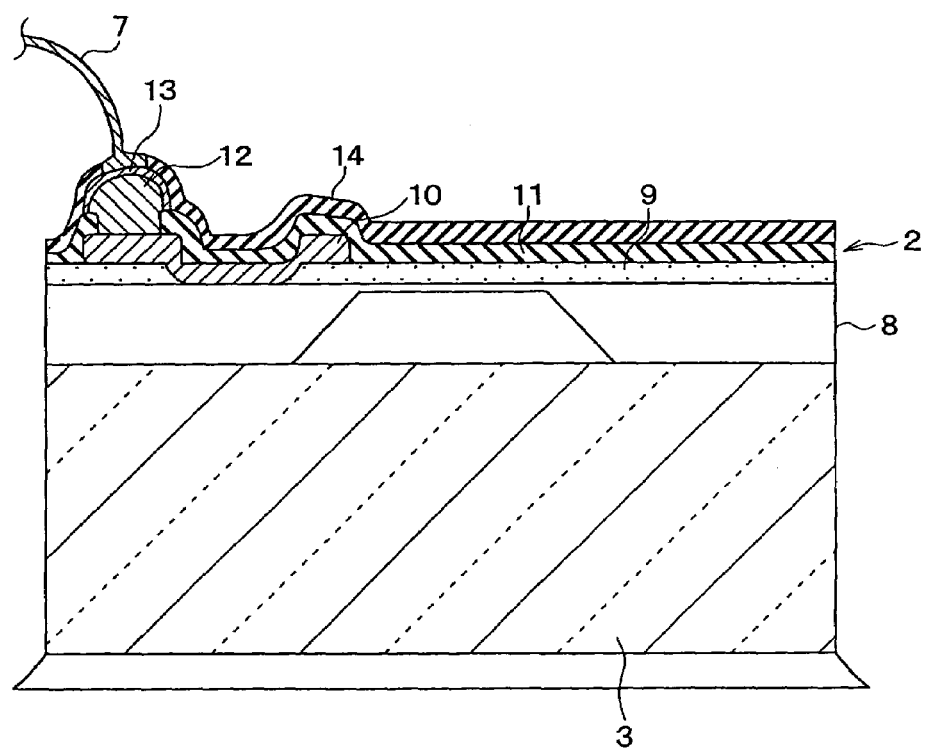
FIG. 2 is an enlarged sectional view showing a wire bonding portion of a sensor chip in the pressure sensor.

As shown in FIG. 2, an Au wire 7 is bonded to the Au film 13 in the sensor chip 2. Furthermore, a protective film 14 made of an organic material, for example, polyimideamide (PEAI) or polyamide (PIQ) is arranged to cover at least the surface of the Au film 13 and the vicinity of the opening portion of the protective film 11.

The semiconductor substrate 8 has a recess portion to form the diaphragm. The surface of the semiconductor substrate 8, having the recess portion, is bonded to one surface of the glass pedestal 3, and the other surface of the glass pedestal 3 is bonded to the lower casing 5 by using an adhesive 15, so that the sensor chip 2 is fixed.

As shown in FIG. 1, the lower casing 5 is covered and closed by the upper casing 4 so that a pressure introduction space is formed by the upper casing 4 and the lower casing 5. The upper casing 4 has a pressure introducing hole 4a through which a fluid that is a pressure detection subject is introduced into the pressure introduction space.

Each of the Au wires 7 electrically connected to the electrical circuit of the sensor chip 2 is connected to each terminal 6 which extends to an exterior from the lower casing 5. Therefore, the sensor chip 2 is electrically connected to the exterior through the Au wires 7 and the terminals 6.

When a fluid is supplied to the pressure introduction space through the pressure introduction hole 4a of the upper casing 4, a pressure of the fluid is applied to the sensor chip 2. Accordingly, the diaphragm of the sensor chip 2 is bent, and a resistance value of the gauge resistance formed in the semiconductor substrate 8 changes in accordance with a bending of the diaphragm. The variation in the resistance value is output to the exterior through the electrical circuit, the Al film 10, the Ti film 12, the Au film 13, the Au wires 7 and the terminals 6, thereby the pressure of the fluid can be detected.

Next, a method of manufacturing the pressure sensor 1 will be now described. Here, the method of manufacturing the sensor chip 2 in the pressure sensor 1 is mainly described with reference to FIGS. 3A to 5D.

Figure 3A:
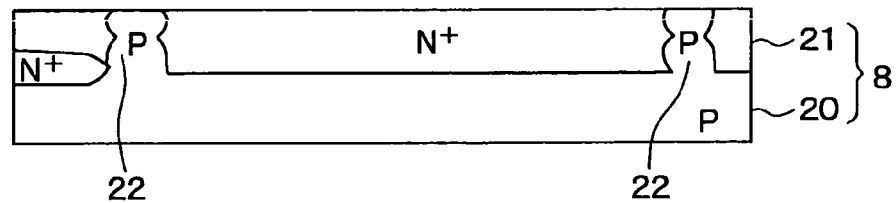
FIG. 3A to FIG. 3D are schematic diagrams showing manufacturing steps of a pressure sensor, according to the first embodiment.

First, as shown in FIG. 3A, a semiconductor substrate 8 is prepared. That is, a $N^+$-type epitaxial layer 21 is formed on a P-type silicon substrate 20, so as to form the semiconductor substrate 8. Then, an ion implantation of a P-type impurity is performed, and a P-type element isolating layer 22 is formed by activating this P-type impurity. Therefore, the $N^+$-type epitaxial layer 21 is isolated.

Figure 3B:
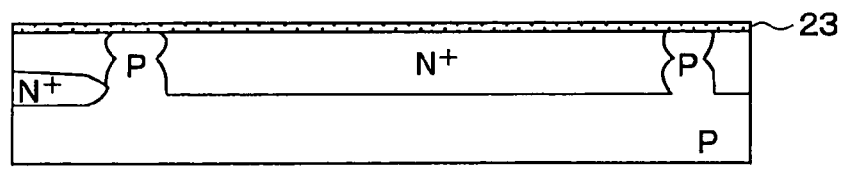
Figure 3C:
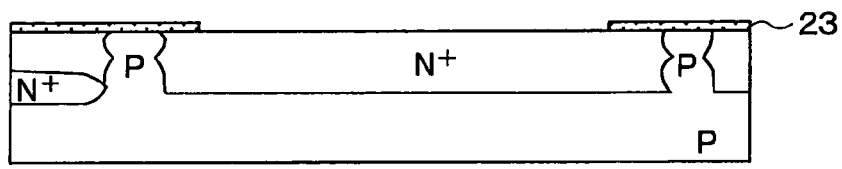
Figure 3D:
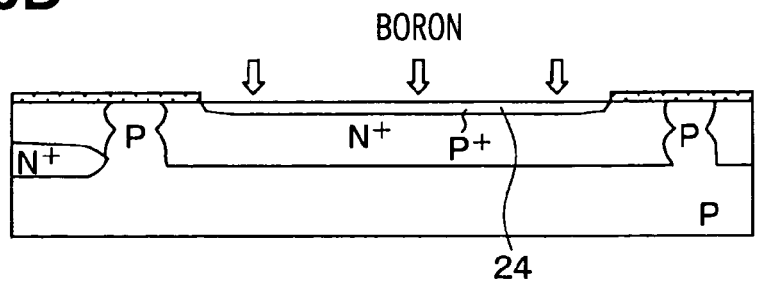

Next, as shown in FIG. 3B, an oxidation film 23 (insulation film) is formed on a surface of the semiconductor substrate 8 by thermal oxidation. Then, as shown in FIG. 3C, a part of the oxidation film 23 is removed by photo-etching in a predetermined portion on the surface of the $N^+$-type epitaxial layer 21. Next, an ion implantation of a P-type impurity, for example, boron is performed so that a gauge resistance 24 is formed by its activation, as shown in FIG. 3D.

Figure 4A:
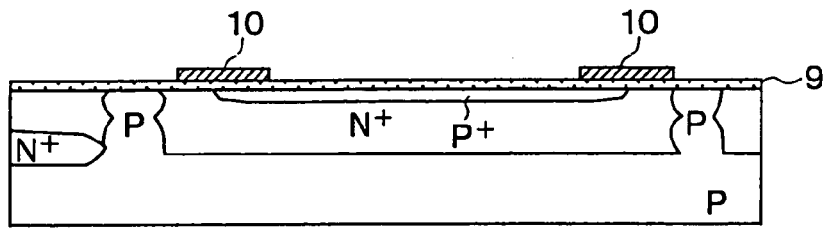
FIG. 4A to FIG. 4D are schematic diagrams showing manufacturing steps of the pressure sensor after the manufacturing steps of FIGS. 3A–3D, according to the first embodiment.

Next, in FIG. 4A, an oxidation film 9 is formed on the surface of the semiconductor substrate 8 after the oxidation film 23 is removed once. A sacrifice oxidation can be performed after the oxidation film 23 is removed, before the oxidation film 9 is formed on the surface of the semiconductor substrate 8. Then, opening portions are formed at predetermined positions of the oxidation film 9, and an Al film 10 is formed on the oxidation film 9. Thereafter, as shown in FIG. 4A, a predetermined pattern of the Al film 10 is formed by photo-etching.

Figure 4B:
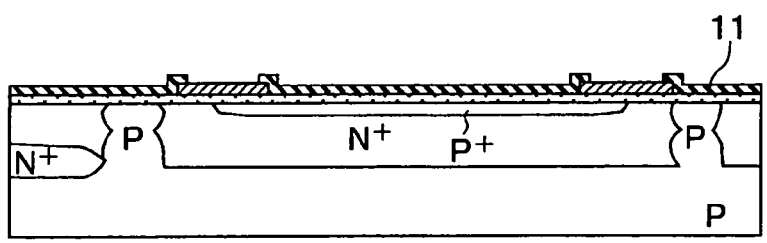

In the step of FIG. 4B, a protective film 11 is formed on the surface of the Al film 10 and the oxidation film 9, and a part of the protective film 11 is removed by etching, so that the Al film 10 is exposed at predetermined positions.

Figure 4C:
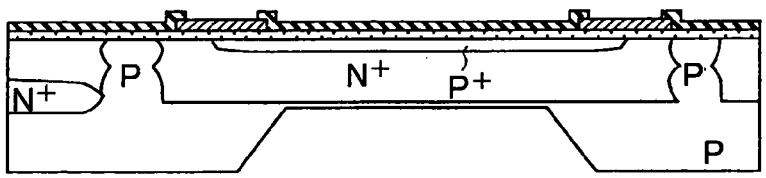
Figure 4D:
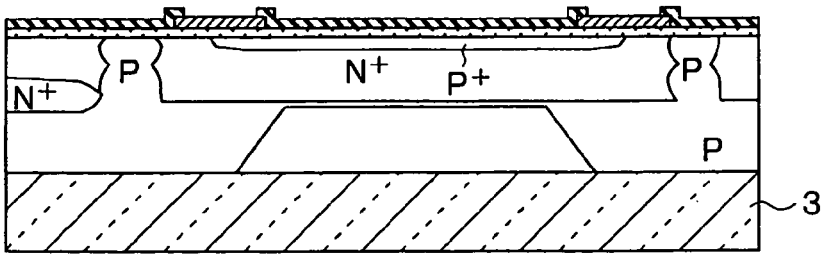

Next, as shown in FIG. 4C, a back surface of the semiconductor substrate 8 is etched so as to form a recess portion. Therefore, a diaphragm is formed in the semiconductor substrate 8. Then, the back surface of the semiconductor substrate 8, having the recess portion, is bonded to the glass pedestal 3.

Figure 5A:
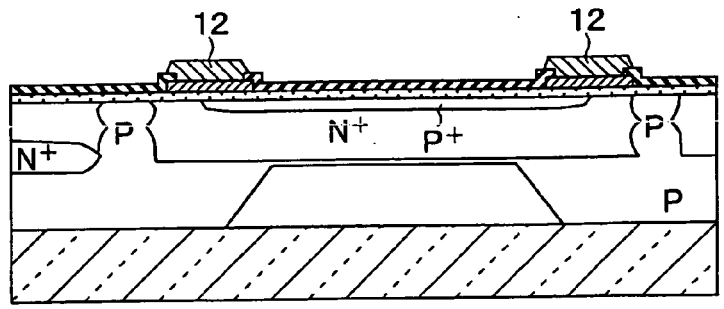
FIG. 5A to FIG. 5D are schematic diagrams showing manufacturing steps of the pressure sensor after the manufacturing steps of FIGS. 4A–4D, according to the first embodiment.
Figure 5B:
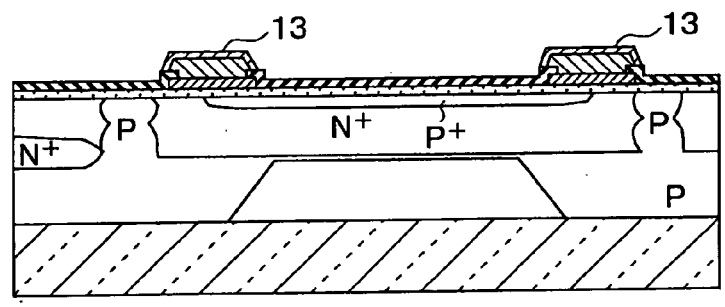

Furthermore, as shown in FIG. 5A, an electroless nickel plating is performed on the surface of the Al film 10 exposed from the protective film 11, so as to form a Ni film 12. Then, an Au electroless plating is performed on the surface of the Ni film 12, so as to form an Au film 13.

Figure 5C:
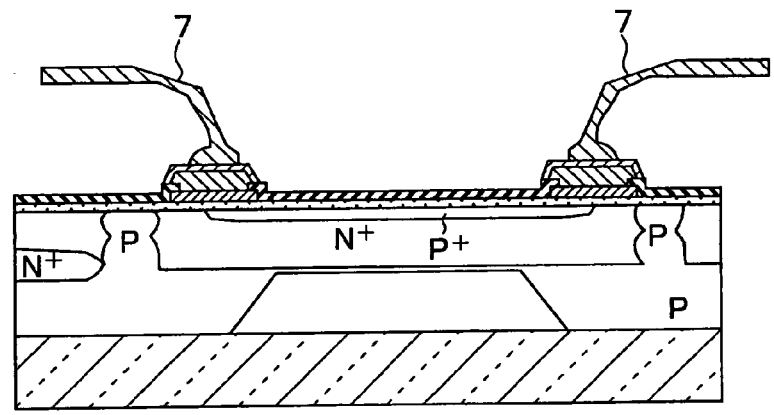
Figure 5D:
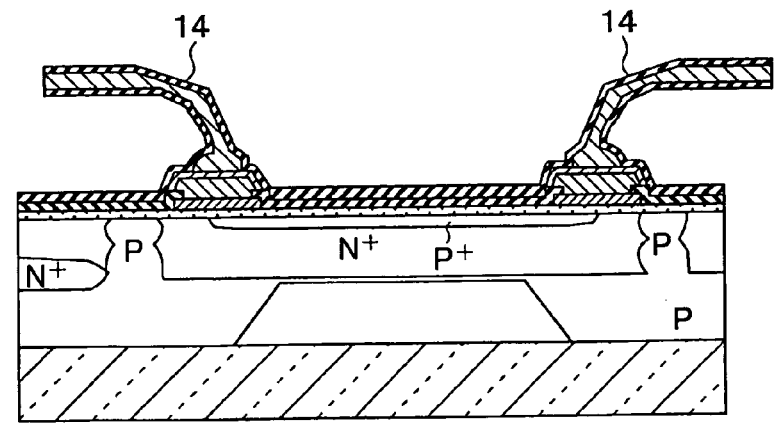

Then, the glass pedestal 3 and the sensor chip 2 are attached to the lower casing 5. Thereafter, the Au wire 7 is bonded to the Au film 13, so that the Au wire 13 and the Au wire 7 are bonded to each other as shown in FIG. 5C. At the step of FIG. 5D, an organic material such as polyimideamide (PEAI) or polyimide (PIQ) is applied to the surface of the semiconductor substrate 8 having the Au wires 7, so as to form a protective film 14. Here, the protective layer 14 covers at least the surface of the Au film 13 and the vicinities of the opening portions of the protective film 11. As an example, as shown in FIG. 5D, the protective film 14 covers all of the Au wires 7, the Au film 13, the boundary between the Au film 13 and the protection film 11, and the protective film 11. In FIG. 5A, the Ni film 12 is formed. However, a Ti film 12 can be formed similarly to the Ni film.

In the pressure sensor 1 of this embodiment, by forming the Ni film (Ti film) 12 and the Au film 13 on the Al film 10, a possibility that the aluminum film 10 will contact a pressure detection subject made of a corrosion medium can be effectively reduced. For example, a sealing between the Au film 13 and a SiN layer of the protection film 11 may be insufficient, and a corrosion medium may pass through therebetween. Furthermore, a hole may be formed in the protective film 11 covered on the Al film 10. However, in this embodiment, the protective film 14 made of an organic material covers at least the surface of the Au film 13 and the vicinity of each opening portion of the protection film 11.

Accordingly, the protective film 14 effectively prevents the corrosion medium from contacting the surface of the Au film 13 and the vicinity of the opening portion of the protective film 11. As a result, it can prevent the Al film 10 from contacting the corrosion medium, thereby preventing the Al film 10 from being corroded. Thus, an O-ring or an oil, for protecting the Al film 10, is unnecessary, and the number of components for forming the pressure sensor can be reduced. In this embodiment, the size of the pressure sensor 1 can be effectively reduced, and assembling steps of the pressure sensor 1 can be made simple.

Furthermore, in the example shown in FIG. 5D, even when a hole is formed in the protective film 11, the protective film 14 prevents the Al film 10 from being exposed to the corrosion medium through the hole, because the protective film 14 directly covers all the surface of the protective film 11.

Second Embodiment

Figure 6:
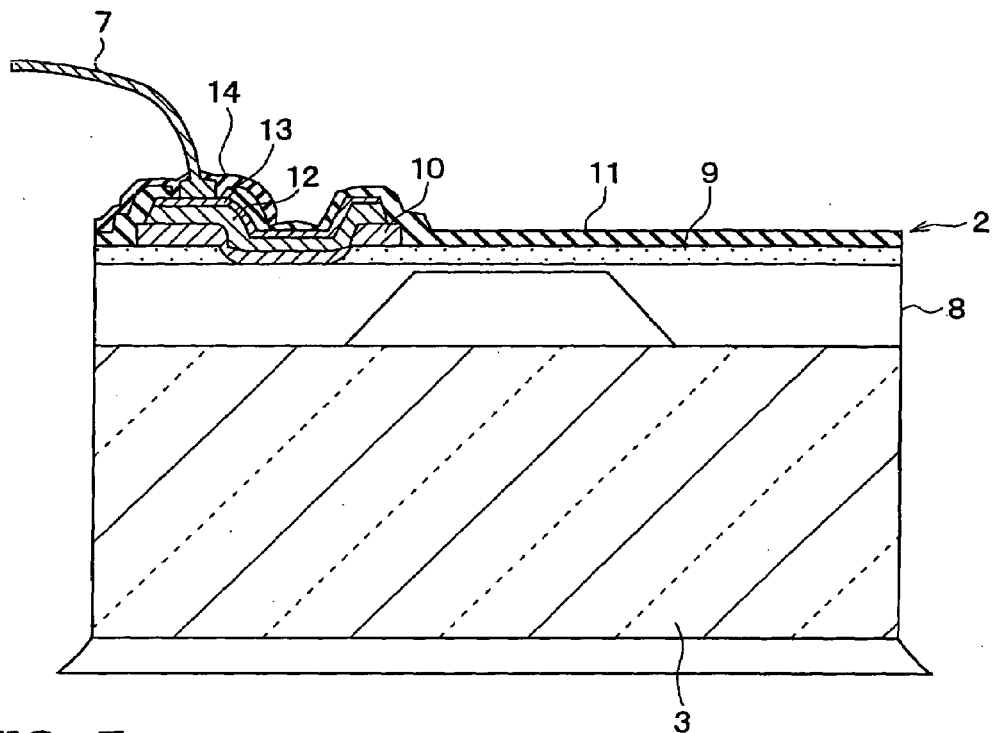
FIG. 6 is an enlarged sectional view showing a wire bonding portion of a sensor chip in a pressure sensor according to a second preferred embodiment of the present invention.

The second embodiment of the present invention will be now described with reference to FIG. 6. In the second embodiment, the structures of the Ti film 12 and the Au film 13 of the first embodiment are changed. FIG. 6 shows a sensor chip 2 of a pressure sensor in the second embodiment.

As shown in FIG. 6, a Ti film 12 and an Au film 13 are formed approximately on all surface of the Al film 10. Furthermore, the Ti film 12 and the Au film 13 are covered by a protective film 11, together with the Ai film 11. That is, after the Ti film 12 and the Au film 13 are formed on the Al film 10, the protective film 11 covers the surfaces of the oxidation film 9, the Al film 10, the Ti film 12 and the Au film 13, as shown in FIG. 6. The protection film 11 has at least an opening portion through which the Au wire 7 is bonded to the Au film 13. Then, at least the surface of the Au film 13 and the vicinity of the opening portion of the protection film 11 are covered by a protective film 14. The protective film 14 is made of an organic material, for example, polyimideamide (PEAI) or polyimide (PIQ).

In the second embodiment, as described above, the Ti film 12 and the Au film 13 are formed approximately on the all surface of the Al film 10. Therefore, an exposed area of the Al film 10 becomes smaller. Furthermore, because the surface of the Au film 13 and the vicinity of the opening portion of the protective film 11 are covered by the protective film 14, it can prevent the corrosion medium from contacting the Al film 10.

In the above-described first embodiment, the Ti film 12 and the Au film 13 are formed after the protective film 11 is formed. However, in the second embodiment, after the Ti film 12 and the Au film 13 are on the Al film 10, the protective film 11 is formed to cover the exposed surfaces of the oxidation film 9, the Al film 10, the Ti film 12 and the Au film 13. Then, after the Au wire 7 is bonded to the Au film 13, the protective layer 14 is formed. Therefore, the pressure sensor 1 having the sensor chip 2 can be easily formed.

In the second embodiment, the other parts are similar to those of the above-described first embodiment.

Third Embodiment

Figure 7:
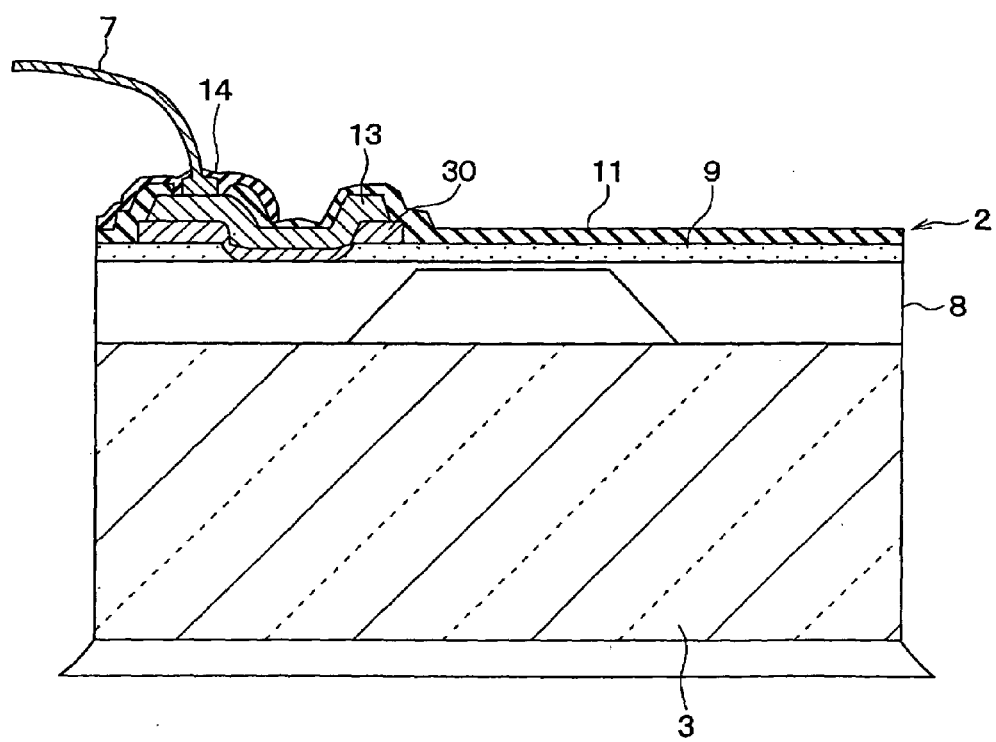
FIG. 7 is an enlarged sectional view showing a wire bonding portion of a sensor chip in a pressure sensor according to a third embodiment of the present invention.
Figure 8:
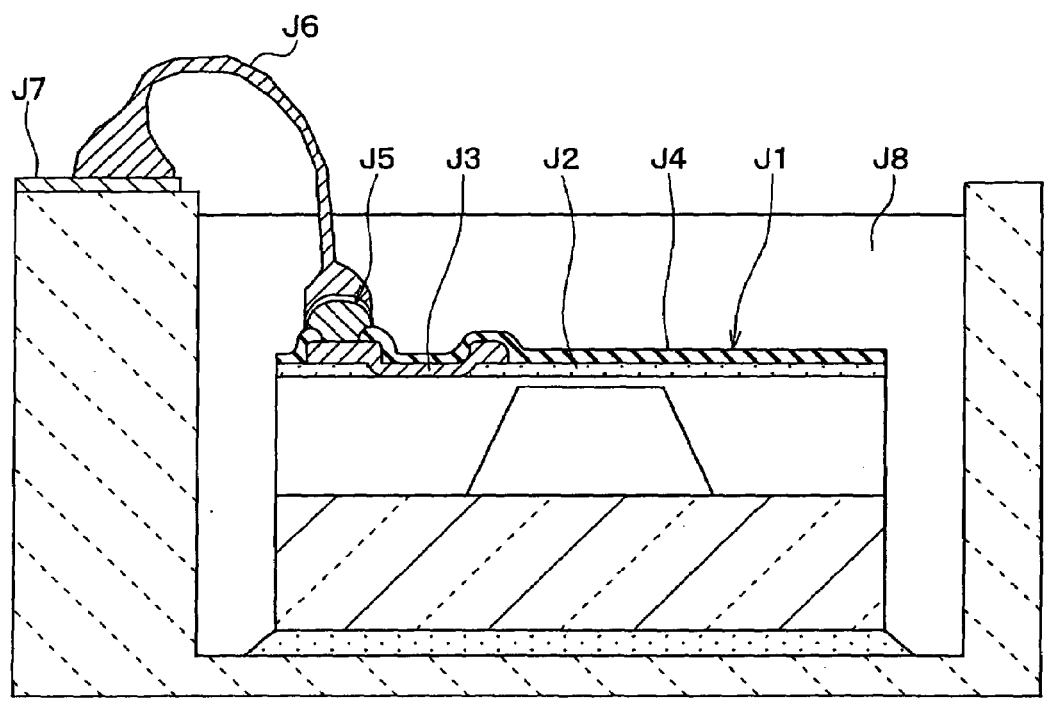
FIG. 8 is a schematic sectional view showing a corrosion preventing structure of a pressure sensor in a related art.

The third embodiment will be now described with reference to FIG. 7. FIG. 7 shows a sensor chip 2 of a pressure sensor 1 of the third embodiment. In the third embodiment, a Cu film 30 is used instead of the Al film 10 of the second embodiment. When the Cu film 30 is used instead of the Al film 10, an Au plating can be directly performed on the Cu film 30. Therefore, in the third embodiment, the Au film 13 is directly formed on the surface of the Cu film 30, and the Ti film 12 of the second embodiment can be omitted.

That is, in the third embodiment, after the Au film 13 is formed approximately on all the surface of the Cu film 30, the protection film 11 is formed. Next, the Au wire 7 is connected to the Au film 13, and the protective film 14 covers at least the exposed surface of the Au film 13 and the vicinity of the opening portion of the protective film 11. In this case, the manufacturing method of the pressure sensor 1 can be made simple.

In the third embodiment, the Cu film 30 and the Au film 13 can be formed by etching to have a predetermined pattern, after the Cu film 30 and the Au film 13 are formed by sputter.

Similarly, the Cu film 30 can be used instead of the Al film 10 of the first embodiment. In this case, the Ti film 12 can be omitted, similarly to the second embodiment.

In the third embodiment, the other parts can be made similar to those of the above-described first or second embodiment.

Other Embodiments

Although the present invention has been described in connection with some preferred embodiments thereof with reference to the accompanying drawings, it is to be noted that various changes and modifications will become apparent to those skilled in the art.

For example, in the above-described embodiments, the pressure detection subject of the pressure sensor is a corrosion medium such as a corrosion liquid or a corrosion gas. However, the present invention can be applied to a pressure sensor for detecting a pressure of a medium which is difficult to corrode a sensor chip.

In the above-described third embodiment, the Cu film 30 is used as the Al film 10 in the pressure sensor 1 of the second embodiment. However, the Cu film 30 can be used as the Al film 10 in the pressure sensor 1 of the first embodiment. Furthermore, a metal film other than the Al film 10 or the Cu film 30 having an electrical conductor performance can be used instead of the Al film 10 or the Cu film 30.

While the invention has been described with reference to preferred embodiments thereof, it is to be understood that the invention is not limited to the preferred embodiments and constructions. The invention is intended to cover various modification and equivalent arrangements. In addition, while the various elements of the preferred embodiments are shown in various combinations and configurations, which are preferred, other combinations and configuration, including more, less or only a single element, are also within the spirit and scope of the invention.

What is claimed is:

1. A pressure sensor comprising:
a semiconductor substrate having a diaphragm in which an electrical circuit including a gauge resistance is formed;
an insulation film provided on a surface of the semiconductor substrate, the insulation film having a conductor hole from which a predetermined portion of the electrical circuit is exposed;
a first metal film provided on the insulation film and electrically connected to the electrical circuit through the conductor hole;
a second metal film having a corrosion resistance and provided on the first metal film;
a first protective film which covers the first metal film and has an opening portion from which a portion of the second metal film is exposed;
a wire bonded to the second metal film at the portion exposed from the first protective film; and
a second protective film made of an organic material, which covers at least the surface of the second metal film exposed from the first protective film, and a vicinity of the opening portion of the first protective film.

2. The pressure sensor according to claim 1, wherein the second protective film is made of polyimideamide (PEAI) or polyimide (PIQ).

3. The pressure sensor according to claim 1, wherein:
the second metal film is provided approximately on an entire area of the first metal film; and
the first protective film is provided to cover the second metal film.

4. The pressure sensor according to claim 1, wherein:
the first metal film is an Al film;
the second metal film is an Au film; and
the Au film is provided on the Al film through a Ti film.

5. The pressure sensor according to claim 1, wherein:
the first metal film is a Cu film;
the second metal film is an Au film; and
the Au film is directly provided on the Cu film.

6. The pressure sensor according to claim 1, wherein the second protective film covers an entire surface of the first protective film.

7. The pressure sensor according to claim 1, wherein the insulation film is made of an oxidation film, and the first protective film is provided to cover the first metal film and the oxidation film.

8. The pressure sensor according to claim 1, wherein the second metal film is constructed of two metal layers of an Au film and a Ti film.

9. The pressure sensor according to claim 1, wherein the second protective film directly contacts at least the surface of the second metal film exposed from the first protective film, and the vicinity of the opening portion of the first protective film.

* * * * *